(12) United States Patent
Nystrom et al.

(10) Patent No.: US 7,980,671 B2
(45) Date of Patent: Jul. 19, 2011

(54) ELECTROSTATIC ACTUATOR AND METHOD OF MAKING THE ELECTROSTATIC ACTUATOR

(75) Inventors: Peter J. Nystrom, Webster, NY (US); Donald J. Drake, Rochester, NY (US); Peter M. Gulvin, Webster, NY (US); Joseph A. DeGroot, Rochester, NY (US); Jun Ma, Penfield, NY (US); Nancy Y. Jia, Webster, NY (US); Andrew W. Hays, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 908 days.

(21) Appl. No.: 11/447,275

(22) Filed: Jun. 6, 2006

(65) Prior Publication Data

US 2007/0279457 A1    Dec. 6, 2007

(51) Int. Cl.
*B41J 2/06* (2006.01)
(52) U.S. Cl. ............ 347/55; 347/54; 347/68; 347/70; 347/71
(58) Field of Classification Search ............ 347/55, 347/54, 68–72
See application file for complete search history.

(56) References Cited

U.S. PATENT DOCUMENTS

| | | | | |
|---|---|---|---|---|
| 6,608,268 B1 * | 8/2003 | Goldsmith | .................... | 200/181 |
| 6,803,534 B1 * | 10/2004 | Chen et al. | .................... | 200/181 |
| 7,430,355 B2 * | 9/2008 | Heikenfeld et al. | .......... | 385/129 |
| 2001/0024325 A1 * | 9/2001 | Kowarz et al. | ................ | 359/566 |
| 2002/0097303 A1 * | 7/2002 | Gulvin et al. | .................... | 347/65 |
| 2004/0155942 A1 * | 8/2004 | Anagnostopoulos et al. | .. | 347/64 |
| 2005/0012577 A1 * | 1/2005 | Pillans et al. | .................... | 335/78 |
| 2005/0134644 A1 * | 6/2005 | Pasch et al. | .................... | 347/44 |
| 2005/0285902 A1 | 12/2005 | Gulvin et al. | | |
| 2006/0022158 A1 | 2/2006 | Feinberg et al. | | |

OTHER PUBLICATIONS

Jurgen Wibbeler, Gunter Pfeifer, and Michael Heitschold, Parasitic Charging of Dielectric Surfaces in Capacitive Microelectromechanical Systems (MEMS), Sensors and Actuators A 71 (1998), pp. 74-80.

* cited by examiner

*Primary Examiner* — Matthew Luu
*Assistant Examiner* — Henok Legesse
(74) *Attorney, Agent, or Firm* — MH2 Technology Law Group LLP

(57) ABSTRACT

The present application is directed to electrostatic actuators, and methods of making electrostatic actuators. In one embodiment, an electrostatic actuator of the present application comprises a first electrode and a second electrode. The second electrode is positioned in proximity to the first electrode so as to provide a gap between the first electrode and the second electrode. The first electrode is capable of being deflected toward the second electrode. A dielectric structure comprising a dielectric landing post is positioned in the gap between the first electrode and the second electrode, the dielectric structure extending over a greater surface of the gap than the landing post. The landing post protrudes out into the gap so as to limit the minimum contact spacing between the first electrode and the second electrode.

9 Claims, 5 Drawing Sheets

ELECTROSTATIC ACTUATOR AND METHOD OF MAKING THE ELECTROSTATIC ACTUATOR

FIELD OF THE DISCLOSURE

The present application is directed to an electrostatic actuator, and more particularly to an electrostatic actuator including a dielectric landing post.

BACKGROUND OF THE DISCLOSURE

Electrostatic actuators are well known for use in a variety of applications, such as, in fluid ejectors for ink jet recording or printing devices. Electrostatic actuators often comprise one or more membranes which can be deflected using electrostatic forces.

FIG. 1 illustrates one example of an electrostatically actuated diaphragm. 10 in a relaxed state. Diaphragm 10 can comprise a substrate 12, an insulator layer 14, a stationary electrode 16, a second insulator layer 18 and a membrane 20. Substrate 12 can be, for example, a silicon wafer. Insulator layers 14 and 18 can be, for example, thin film insulators, such as, silicon nitride. Stationary electrodes 16 and 20 may comprise, for example, a metal or a doped semiconductor, such as doped polysilicon.

Membrane 20 may also comprise a conductive landing post 22, which often comprises the same material as membrane 20, such as metal or a doped semiconductor. Landing post 22 can aid in reducing problems with stiction, which is a common failure mode in electrostatic actuators, where two surfaces that come into contact become permanently attached by Van der Waals forces. Because landing post 22 reduces the amount of surface area that can come into contact, stiction forces are decreased.

In operation, a voltage potential is applied to the stationary electrode 16, which attracts membrane 20 and causes it to deflect, as illustrated in FIG. 2. When fully deflected, landing post 22 can touch insulator layer 18, causing a reduction in the gap between the electrodes. The reduction in the gap often creates high electric fields that can lead to dielectric breakdown, lifetime degradation and other negative performance effects.

SUMMARY OF THE DISCLOSURE

In accordance with the disclosure, one embodiment of the present application is directed to an electrostatic actuator comprising a first electrode and a second electrode. The second electrode is positioned in proximity to the first electrode so as to provide a gap between the first electrode and the second electrode. The first electrode is capable of being deflected toward the second electrode. A dielectric structure comprising a dielectric landing post is positioned in the gap between the first electrode and the second electrode, the dielectric structure extending over a greater surface of the gap than the landing post. The landing post protrudes out into the gap so as to limit the minimum contact spacing between the first electrode and the second electrode.

Another embodiment of the present application is directed to a method for forming an electrostatic actuator. The method comprises depositing a first electrode on a substrate. A dielectric structure comprising a dielectric landing post is formed on the first electrode. A sacrificial layer is also formed on the first electrode, either before or after the dielectric landing post has been formed. A second electrode is deposited on the dielectric landing post and the sacrificial layer. At least a portion of the sacrificial layer is removed to form a gap between the first electrode and the second electrode, the dielectric structure extending over a greater surface of the gap than the landing post. The landing post protrudes out into the gap so as to limit the minimum contact spacing between the first electrode and the second electrode.

Another embodiment of the present application is directed to a fluid drop ejector comprising a first electrode and a second electrode positioned in proximity to the first electrode so as to provide a gap between the first electrode and the second electrode. The first electrode is capable of deflecting toward the second electrode. A dielectric structure comprising a dielectric landing post is positioned in the gap between the first electrode and the second electrode, the dielectric structure extending over a greater surface of the gap than the landing post. The landing post protrudes out into the gap so as to limit the minimum contact spacing between the first electrode and the second electrode. A face plate layer surrounds the first electrode to form a fluid pressure chamber between the face plate and the first electrode where fluid is capable of being stored. The face plate has a nozzle through which the fluid can be ejected.

Additional objects and advantages of the disclosure will be set forth in part in the description which follows, and can be learned by practice of the disclosure. The objects and advantages of the disclosure will be realized and attained by means of the elements and combinations particularly pointed out in the appended claims.

It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

Figure 3:
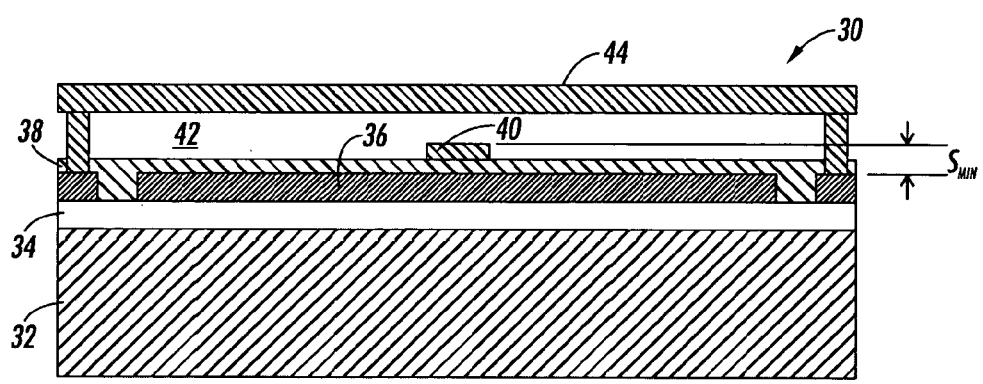
FIG. 3 illustrates an embodiment of an electrostatic actuator device, according to an embodiment of the present application.

FIG. 3 illustrates an embodiment of an electrostatic actuator device 30, according to an embodiment of the present application. Electrostatic actuator device 30 can include a first electrode 36 formed on a substrate 32. For purposes of this application, the term "on" is defined so as not to require direct physical contact. Thus, for example, as illustrated in FIG. 3, an insulator layer 34 can be formed between electrode 36 and substrate 32. In other embodiments, electrode 36 can be formed in direct physical contact with substrate 32.

An electrode 44 is positioned in proximity to electrode 36 so as to provide a gap 42 between electrode 36 and electrode 44. As is well known in the art, a voltage may be applied to electrode 36 in order to control movement of electrode 44. For example, electrode 44 may be controlled so as to deflect toward electrode 36.

Substrate 32 may be formed of any desired material that will provide suitable mechanical support for device 30. Examples of substrates include semiconductor wafers, such as silicon wafers, silicon carbide wafers and gallium arsenide wafers, and insulating substrates, such as glass substrates.

Insulator layer 34 may comprise any suitable material with appropriate electrically insulating properties, and which is otherwise compatible for use in electrostatic actuators. Examples of suitable insulator materials include silicon dioxide, silicon nitride, or an insulating polymer. Insulator layer 34 may be any suitable thickness that will provide the desired electrical insulation between substrate 32 and electrode 36. For example, Insulator layer 34 may range in thickness from about 0.1 micron to about 2 microns.

Electrodes 36 and 44 may be formed of any suitable electrically conductive material. Examples of such materials include doped polysilicon, conducting polymers, or metals, such as aluminum. Electrodes 36 and 44 may be any suitable thickness. For example, electrode 36 may range in thickness from about 0.1 micron to about 1 um and electrode 44 may range in thickness from about 0.5 micron to about 5 um.

Gap 42 may be filled with any suitable fluid that allows the desired movement of electrode 44. In one embodiment, gap 42 is an air gap, as is well known in the art.

In embodiments, a dielectric structure including insulator layer 38 and dielectric landing post 40 can be positioned in gap 42 between electrode 36 and electrode 44. In some embodiments, insulator layer 38 and dielectric landing post 40 may be separate layers, as shown in FIG. 3. In yet other embodiments, insulator layer 38 and dielectric landing post 40 may be formed from the same insulating layer, as will be discussed in greater detail below. The dielectric structure may be positioned to extend over a greater surface of the gap than the landing post. For example, as illustrated in FIG. 3, insulating layer 38 of the dielectric structure is positioned to extend over the entire surface of electrode 36 in gap 42. In other embodiments, insulating layer 38 can cover the entire surface of membrane 44 within gap 42. In yet other embodiments, insulating layer 38 can extend to cover selected portions of electrode 36 and/or electrode 44 in gap 42.

In one embodiment, dielectric layer 38 and dielectric landing post 40 may be positioned on electrode 36. For example, as illustrated in FIG. 3, dielectric landing post 40 may be formed over and protrude up from insulator layer 38. In other embodiments, described below with respect to FIG. 4, dielectric landing post 40 may comprise a bump layer 40a and a raised portion 40b of a conformal insulating layer 38, which is formed over bump layer 40a.

In still other embodiments, all or a portion of the dielectric structure forming insulator layer 38 and dielectric landing post 40 may be positioned on electrode 44. For example, insulator layer 38 may be formed on a surface of electrode 44 within gap 42, and dielectric landing post 40 may be formed on and protrude down from insulator layer 38. In yet another embodiment, insulator layer 38 may be formed on electrode 36, and dielectric landing post 40 may be formed on and protrude down from a surface of electrode 44 within gap 42.

In some embodiments, both insulator layer 38 and dielectric landing post 40 can be formed of insulators, such as silicon dioxide or silicon nitride. In other embodiments, portions of dielectric landing post 40 can be formed of materials other than insulators. For example, in the embodiment of FIG. 4, dielectric landing post 40 can include a bump layer 40a that may comprise any material capable of providing a bump of desired thickness, including conductive materials, insulative materials and semiconductive materials. Examples of such materials include both inorganic materials, such as silicon dioxide, silicon nitride, aluminum, and polysilicon, and organic materials, such as photoresist, SU8, polyimide, or other polymers. If the bump layer 40a is conductive, measures may be taken to isolate bump layer 40a from the underlying electrode 36, such as by inserting an insulative layer between electrode 36 and bump layer 40a. This would decrease the maximum electric field strength by avoiding conductive sharp corners, as discussed in greater detail below.

Together, insulator layer 38 and dielectric landing post 40 limit the minimum contact spacing between the first electrode and the second electrode. As shown in FIG. 3, the minimum contact spacing, $S_{min}$, is the total thickness of insulator layer 38 and landing post 40 that is positioned between electrodes 36 and 44. $S_{min}$ may be chosen to be any suitable distance. For example, $S_{min}$ may range from about 0.1 micron to about 1 micron.

In operation, when a voltage is applied to electrode 36, thereby causing electrode 44 to deflect toward electrode 36, the minimum distance between electrodes 36 and 44 will be determined by $S_{min}$. Limiting the minimum contact spacing in this manner can help to reduce the electric fields formed between electrodes 36 and 44, compared to devices which employ conductive landing posts, since the combined dielectric thickness of insulator layer 38 and dielectric landing post 40 provides a greater dielectric separation between the electrodes 36 and 44, than in devices such as the device of FIG. 1, where landing post 40 is conductive. By limiting the minimum contact spacing, one or more of the problems of dielectric breakdown, lifetime degradation and other negative performance effects, which were discussed above, may be reduced or avoided.

Figure 1:
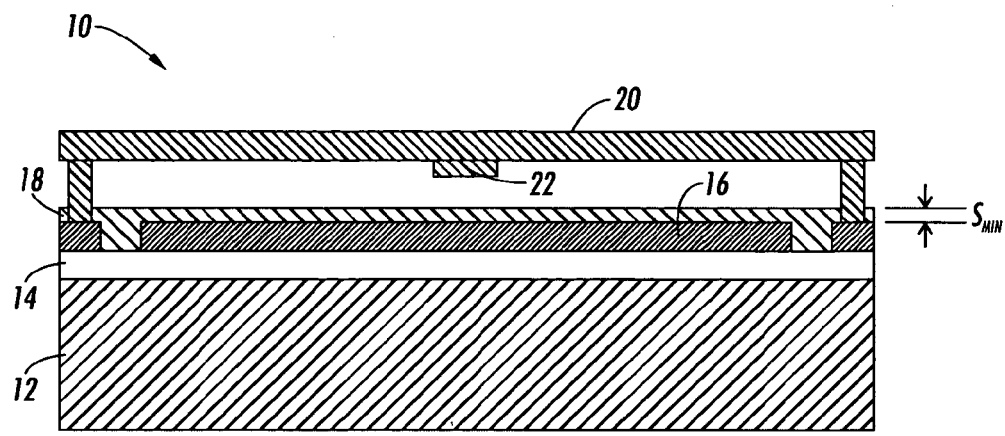
FIG. 1 illustrates one example of an electrostatically actuated diaphragm in a relaxed state.
Figure 2:
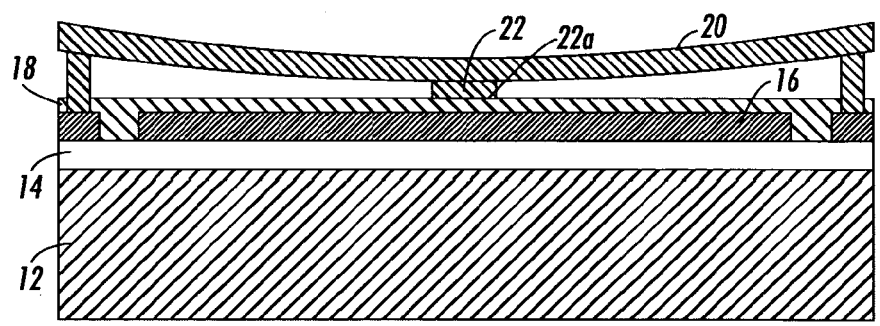
FIG. 2 illustrates the electrostatically actuated diaphragm of FIG. 1 in a deflected state.

Additionally, it has been found that in devices where landing posts are conductive, as in FIGS. 1 and 2, very high electric fields occur in the regions surrounding the conductive landing posts 22, particularly in the vicinity of the landing post corners 22a. In embodiments of the present application, however, dielectric landing post 40 can be formed of an insulative material. Field modeling simulations have suggested that the dielectric landing posts of the present application reduce the magnitude of the electric field in device regions surrounding the dielectric landing post as compared with devices having conductive landing posts. While not intending to be limited by theory, it is believed that the sharp corners of conductive landing posts concentrate the electric field in device regions proximate to the landing post. By employing dielectric landing posts in place of the conductive landing posts, the sharp conductive corners are eliminated, thereby reducing the very high electric fields.

In addition, landing post 22 can aid in reducing stiction problems, which as described above, are a common failure mode in electrostatic actuators. Because landing post 22 reduces the amount of surface area of electrode 44 that can come into contact with insulator layer 38, stiction forces are decreased.

FIGS. 4A to 4E illustrate a method of making an electrostatic actuator device, according to an embodiment of the present application. FIGS. 4A to 4E only show portions of the device relevant to the process being illustrated. For example, a portion of electrode 44 is shown having one end anchored to the substrate. However, it is to be understood that electrode 44 may be anchored to the substrate at a second end (not shown) so as to form a diaphragm, similarly as illustrated in the device of FIG. 3.

Figure 4A:
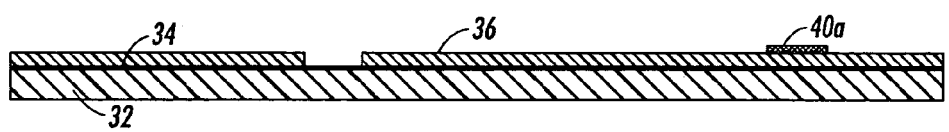
FIGS. 4A to 4E illustrate a method of making an electrostatic actuator device, according to an embodiment of the present application.

In FIG. 4A, insulator layer 34 is formed on substrate 32. Insulator 34 may be any of the materials discussed above for insulator 34, and may be formed by any suitable method. Examples of suitable methods known in the art for forming insulators include chemical vapor deposition (CVD), plasma enhanced chemical vapor deposition (PECVD), and thermal oxidation and nitridation.

Electrode 36, shown in FIG. 4A, can be formed by coating a conductive layer on insulator layer 34 and etching the conductive layer to form an appropriate electrode pattern. Any suitable coating and etching processes may be employed. In one exemplary embodiment, electrode 36 is a doped polysilicon layer formed by chemical vapor deposition, as is well known in the art. The polysilicon can be patterned using suitable photolithography techniques, and then etched using dry or wet etching processes, as is also well known in the art.

A bump layer 40a, as shown in FIG. 4A, can then be formed on electrode 36 by any suitable process. For example, bump layer 40a may be formed by depositing or growing a layer of any suitable material, such as the materials discussed above in the description of bump 40a, using any suitable coating process, and then etching the layer to form the desired bump pattern. Examples of suitable coating processes include chemical vapor deposition (CVD), plasma enhanced chemical vapor deposition (PECVD), and thermal oxidation or nitridation. Suitable etching processes include, for example, dry or wet etching processes, which are well known in the art.

Bump layer 40a may have any suitable shape or size. The thickness of bump layer 40a can be chosen to produce a desired height, $H_b$, of landing post 40 relative to the remaining insulator 38 surrounding landing post 40 on electrode 36, as illustrated in FIG. 4E. The height, $H_b$, should be sufficient so that when electrode 44 is deflected to contact landing post 40, it generally does not contact insulator 38 except at landing post 40. In one exemplary embodiment, the thickness of bump layer 40a ranges from about 0.05 microns to about 0.5 microns.

Figure 4B:
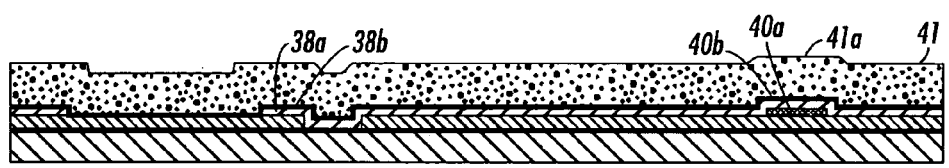

Referring to FIG. 4B, after formation of bump layer 40a, insulator 38 can be formed. In an embodiment, insulator 38 can be formed of one or more conformal layers which conform to the underlying surface so as to result in a raised portion 40b over bump layer 40a. Insulator 38 may be formed of any suitable material, as described above. In one embodiment, insulator 38 can be formed of a silicon dioxide layer 38a and a silicon nitride layer 38b. Silicon nitride layer 38b can act as an etch stop to protect underlying layers during a subsequent sacrificial etch of layer 41, which will be discussed in greater detail below.

In an alternative embodiment for forming landing post 40, an insulating layer 38, which can comprise a single insulating layer or multiple insulating layers, is formed on electrode 36, without forming an underlying bump layer 40a, as in the FIG. 4 embodiment. In this alternative embodiment, insulating layer 38 is formed to the desired thickness of the landing post. For example, insulating layer 38 can be the same thickness as landing post 40 in the FIG. 4 embodiment, which would include the combined thickness of bump layer 40a and layers 38a and 38b. Landing post 40 can then be formed by selectively etching away a desired thickness of insulator layer 38 in all regions except where landing post 40 is to be formed, so that the etched portion of the insulating layer 38 is thinner than the unetched portion that forms landing post 40.

In yet another embodiment for forming landing post 40, an insulating layer 38 is formed on electrode 36 without forming an underlying bump layer 40a. An additional insulating layer can then be deposited on insulating layer 38, and then the additional layer can be selectively etched to form the landing post, similarly as shown in FIG. 3. Yet other methods for forming landing post 40 would be readily apparent to one of ordinary skill in the art.

Referring again to FIG. 4B, a sacrificial layer 41 can be formed on insulator layer 38. The purpose of sacrificial layer 41 is to provide a spacer material on which an electrode 44 can be formed, as shown in FIG. 4D. Sacrificial layer 41 can then be selectively etched away to form gap 42, as shown in FIG. 4E. Any suitable material which can be selectively etched away relative to the other layers of the device structure may be employed for sacrificial layer 41. Examples of such materials include doped oxides, such as phosphosilicate glass (PSG) borophosphosilicate glass (BPSG), or tetra-ethyl-ortho-silicate (TEOS). Any suitable methods for forming the sacrificial layer 41 may be employed. Suitable methods are well known in the art.

Figure 4C:
Figure 4D:
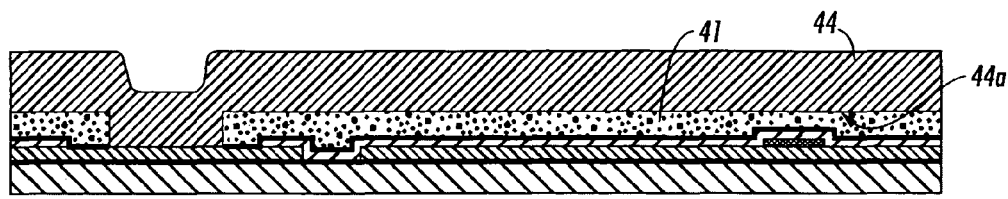
Figure 4E:
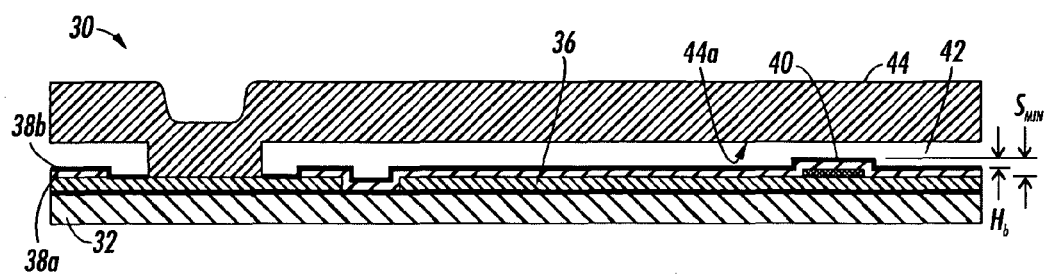

As illustrated in FIG. 4C, sacrificial layer 41 can then be planarized. Planarization removes the topography of sacrificial layer 41 to form a relatively flat surface compared to the surface of sacrificial layer 41 before the planarization process is carried out. For example, as illustrated in FIG. 4B, a raised portion 41a of sacrificial layer 41 is formed due to the underlying bump layer 40a. As seen in FIG. 4C, raised portion 41a of sacrificial layer 41 is substantially removed during the planarization process.

The planarization process may be carried out by any suitable method. In one embodiment, the planarization process is carried out by chemical mechanical polishing (CMP). In yet another embodiment, where sacrificial layer 41 is a doped oxide, the planarization process is carried out by heating to reflow the doped oxide. Other well known planarization process, such as etchback processes, may also be employed to planarize sacrificial layer 41.

In yet other embodiments, sacrificial layer 41 may be a nonconformal layer, which is initially deposited to have a planar surface, so that further planarization is not required. Examples of such nonconformal, planarizing layers include spin-on-glass (SOG), photoresist, and other such layers which can be applied in a liquid form and then dried and/or cured to form a planar surface.

After the planarization process of FIG. 4C, electrode 44 is formed on sacrificial layer 42, as illustrated in FIG. 4D. Any suitable method for forming electrode 44 may be employed. In one embodiment, electrode 44 comprises doped polysilicon formed by a CVD process, as is well known in the art. Other suitable methods for forming electrode 44 are also well known in the art.

Because sacrificial layer 41 includes a planar surface, the underside of electrode 44, which is formed on sacrificial layer 41, also has a planar surface 44a. During operation of the finished device (as shown in FIG. 4E), when electrode 44 is deflected toward electrode 36, a portion of planar surface 44a contacts landing post 40, while a standoff gap having a height of about $H_b$, or greater, remains between the remaining portion of planar surface 44a and insulator 38. Due to this standoff between electrode 44 and insulator 38, only a small amount of the surface area of electrode 44 contacts insulator layer 38, thereby allowing stiction forced to be reduced.

If sacrificial layer 41 is not planar when electrode 44 is formed, the standoff between electrode 44 and insulator layer 38 can be reduced or eliminated. For example, if the planarization process described above with reference to FIG. 4C was not performed to remove bump 41a, shown in FIG. 4B, the portion of electrode surface 44a formed over bump 41a would be concave, so as to fit down over landing post 40 when electrode 44 is deflected during operation of device 30. This would effectively reduce or eliminate the height, $H_b$, of the standoff between electrode 44 and insulator layer 38, allowing surface 44a to contact portions of the surface of insulator layer 38 other than just the surface of landing post 40, and thereby undesirably increasing stiction forces.

After electrode 44 is formed, sacrificial layer 41 can be removed by any suitable process to form gap 42, as shown in FIG. 4E. Examples of suitable processes for removing sacrificial layer 41 include wet etch techniques and dry etch techniques, both of which are well known in the art. One example of a suitable wet etch comprises using hydrofluoric acid to remove sacrificial layer 41, followed by rinsing with deionized water and an alcohol soak to reduce surface tension and thereby reduce capillary forces on electrode 44 as the liquid etchant is removed from gap 42. An oven bake at, for example, approximately 110 degrees C., can then be carried out to further decrease the capillary forces as the alcohol changes state from liquid to gas. Reducing capillary forces in this manner can aid in reducing the likelihood that membrane 40 will be pulled down by the capillary forces of the withdrawing liquid so as to contact a wide area of other surface portions of device 30, such as insulating layer 38 within gap 42, and thereby become permanently stuck to the other surface portions due to stiction forces.

The resulting structure shown in FIG. 4E comprises a first electrode 36 positioned in proximity to electrode 44 so as to provide gap 42 between the electrode 36 and the electrode 44. Dielectric landing post 40, which comprises bump layer 40a and raised portion 40b of conformal insulating layer 38, is positioned on electrode 36 in gap 42. Landing post 40 protrudes out into gap 42 so as to limit the minimum contact spacing, $S_{min}$, between electrode 36 and electrode 44, as discussed above.

In alternative embodiments, the landing post 40 can be formed on electrode 44, so that it protrudes down from electrode 44 into gap 42, as discussed above. In these alternative embodiments, landing post 40 can be formed on electrode 44 using methods similar to the methods discussed above with respect to the embodiment of FIGS. 4A to 4E, as would be understood by one of ordinary skill in the art given the teachings of the present application.

For example, in one such method, an insulator layer 34 and electrode 36 are formed on a substrate 32, similarly as in the embodiment of FIG. 4A. However, in this embodiment, bump layer 40a is not formed on electrode 36, as shown in FIG. 4A. Instead, layers 38a and 38b are formed on electrode 36, followed by formation of sacrificial layer 41, similarly as described above with respect to FIG. 4B.

Sacrificial layer 41 is then selectively etched to form a concave portion in the top surface of sacrificial layer 41, by techniques which are well known in the art. The concave portion is formed in sacrificial layer 41 at the desired position of the landing post. For example, the concave portion can be formed at approximately the same position as raised portion 41a in the FIG. 4B embodiment. A landing post can then be formed over sacrificial layer 41a, by depositing and/or etching a landing post dielectric material, such as silicon nitride or silicon dioxide, so as to fill the concave portion, the shape of the concave portion determining the shape of the landing post.

Deposition and etching techniques that may be used for forming such a landing post dielectric are well known in the art.

Following formation of the landing post, an electrode 44 can be formed, and then the sacrificial layer 41 removed, as described above with respect to FIGS. 4D and 4E. The landing post dielectric of the dielectric structure formed in the gap remains after the sacrificial layer 41 is etched, so as to protrude down from electrode 44 into gap 42. In this embodiment, insulator layer 38 formed on electrode 36 may also remain as part of the dielectric structure of gap 42.

Figure 5:
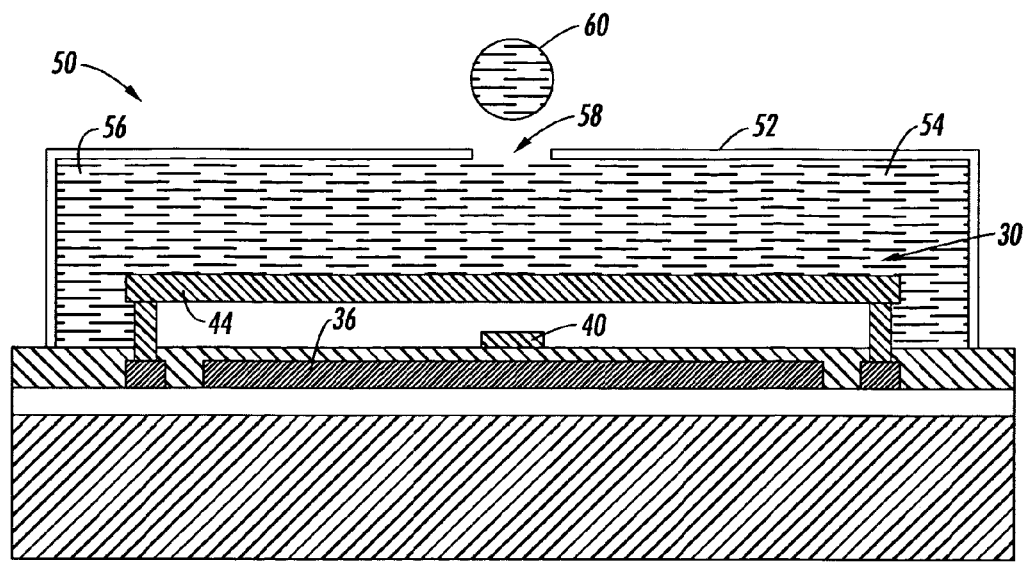
FIG. 5 illustrates a fluid drop ejector comprising an electrostatic actuator device, according to one embodiment of the present application.

The electrostatic actuators of the present application may be used in any application for which electrostatic actuators are suitably employed. For example, the electrostatic actuators of the present application may be employed in fluid drop ejectors, known for use in ink jet printers. An exemplary fluid drop ejector 50 that operates on the principle of electrostatic attraction, according to one embodiment of the present application, will be described with reference to FIG. 5. The basic features of the fluid drop ejector include an electrostatic actuator 30, as described above. The fluid drop ejector further includes a faceplate layer 52. The faceplate layer 52 may be formed from any suitable material known in the art, such as, for example, a polyimide. A liquid 54 to be ejected is provided in fluid pressure chamber 56 provided between electrode 44 and faceplate layer 52. A nozzle hole 58 can be formed in the faceplate layer 52 of the ejector 50.

In operation, a drive signal is applied to electrode 36 to provide a bias voltage that generates an electrostatic field between electrode 36 and electrode 44. Electrode 44 is deflected towards electrode 36 by an electrostatic force of the generated electrostatic field. This draws additional fluid 54 into the fluid pressure chamber 56 to fill the additional volume created in fluid pressure chamber 56 by deflecting electrode 44. Upon release of the bias voltage, elastic restoring forces of the electrode 44 act to return the actuated electrode 44 to its original state. This transmits a pressure to the fluid pressure chamber 56, which acts to force fluid through the nozzle hole 58 as a drop 60. A one-way valve or comparable structure (not shown) may be used to control entrance of fluid into pressure chamber 56 from a fluid reservoir, such as an ink tank, while preventing exit except through nozzle 58.

Figure 6:
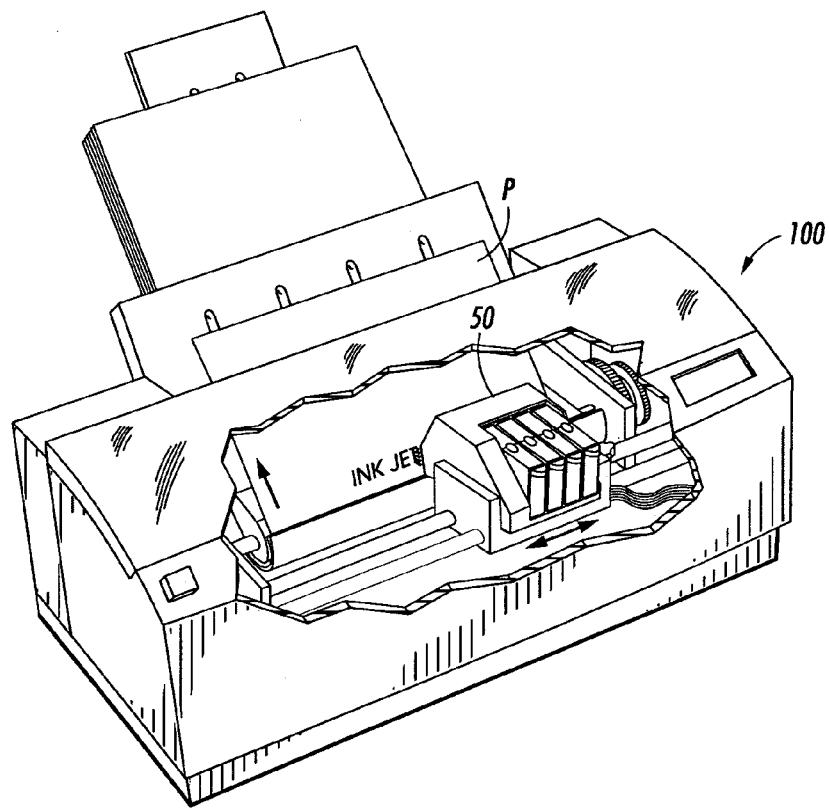
FIG. 6 illustrates one or more fluid drop ejectors incorporated into a printer, according to one embodiment of the present application.

As shown in FIG. 6, one or more fluid drop ejectors 50 can be incorporated into a printer 100, such as an ink jet printer, to eject droplets of ink onto a substrate P. The individual fluid drop ejectors 50 are operated in accordance with signals derived from an image source to create a desired printed image on print medium P. Printer 100 may take the form of the illustrated reciprocating carriage printer that moves a printhead in a back and forth scanning motion, or of a fixed type in which the print substrate moves relative to the printhead.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. An electrostatic actuator comprising:
   a first electrode;
   a second electrode positioned in proximity to the first electrode and attached to the first electrode only at discrete sites so as to provide a gap between the first electrode and the second electrode, the second electrode configured to deflect toward the first electrode; and
   a landing post positioned in the gap and laterally between the discrete sites, wherein the landing post comprises:
      a patterned bump on and in surface contact with a support layer; and
      a conformal insulator layer extending over a greater surface of the gap than the patterned bump and formed over and in surface contact with the patterned bump and in surface contact with the support layer;
   wherein:
   the landing post protrudes out into the gap so as to limit the minimum contact spacing between the first electrode and the second electrode; and
   the gap is between the conformal insulator layer and the second electrode; and wherein: the support layer is the first electrode and the patterned bump physically contacts the first electrode; and the conformal insulator layer physically contacts the patterned bump and the first electrode.

2. The electrostatic actuator of claim 1, wherein the landing post is attached to the first electrode.

3. The electrostatic actuator of claim 1, wherein the conformal insulator layer comprises a silicon nitride layer and a silicon oxide layer.

4. The electrostatic actuator of claim 1, wherein a thickness of the landing post ranges from about 0.05 microns to about 0.5 microns.

5. The electrostatic actuator of claim 1, further comprising an insulator between the substrate and the landing post.

6. The electrostatic actuator of claim 1, wherein:
   the patterned bump is electrically conductive; and
   the conformal insulator layer formed over and in surface contact with the patterned bump is adapted to prevent electrical contact between the second electrode and the electrically conductive patterned bump.

7. A fluid drop ejector comprising:
   a first electrode;
   a second electrode positioned in proximity to the first electrode and attached to the first electrode only at discrete sites so as to provide a gap between the first electrode and the second electrode, the second electrode being configured to deflect toward the first electrode;
   a landing post positioned in the gap and laterally between the discrete sites, wherein the landing post comprises:
      a patterned bump on and in surface contact with a support layer; and
      a conformal insulator layer extending over a greater surface of the gap than the patterned bump and formed over and in surface contact with the patterned bump and in surface contact with the support layer;
   wherein:
   the landing post protrudes out into the gap so as to limit the minimum contact spacing between the first electrode and the second electrode;
   the gap is between the conformal insulator and the second electrode; wherein: the support layer is the first electrode and the patterned bump physically contacts the first electrode; and the conformal insulator layer physically contacts the patterned bump and the first electrode; and
   a face plate layer surrounding the first electrode to form a fluid pressure chamber between the face plate and the first electrode where fluid is capable of being stored, the face plate having a nozzle through which the fluid can be ejected.

8. A printer containing at least one fluid drop ejector according to claim 7.

9. The printer of claim 7, further comprising an insulator between the substrate and the landing post.

* * * * *